United States Patent [19]
Ring

[11] Patent Number: 5,959,563
[45] Date of Patent: Sep. 28, 1999

[54] ANALOGUE TO DIGITAL CONVERTER WITH ADAPTIVE SAMPLE TIMING BASED ON STATISTICS OF SAMPLE VALUES

[75] Inventor: Steven Richard Ring, Yate, United Kingdom

[73] Assignee: LSI Logic Corporation, Milpitas, Calif.

[21] Appl. No.: 08/965,127

[22] Filed: Nov. 6, 1997

[30] Foreign Application Priority Data

Nov. 29, 1899 [GB] United Kingdom .................... 9624842

[51] Int. Cl.$^6$ .................................................. H03M 1/12
[52] U.S. Cl. ........................................... 341/155; 341/166
[58] Field of Search .................................... 341/155, 166, 341/122, 123; 375/269, 332, 322

[56] References Cited

U.S. PATENT DOCUMENTS

| | | | |
|---|---|---|---|
| 4,565,993 | 1/1986 | Brian ......................................... | 340/347 |
| 4,788,696 | 11/1988 | Sakane et al. ............................ | 375/111 |
| 5,090,027 | 2/1992 | Ohsawa ..................................... | 375/322 |
| 5,255,289 | 10/1993 | Tomita ...................................... | 375/332 |
| 5,317,602 | 5/1994 | Onoda et al. ............................. | 375/118 |
| 5,406,329 | 4/1995 | Kashimura et al. ..................... | 348/175 |

*Primary Examiner*—Howard L. Williams
*Assistant Examiner*—Peguy Jean Pierre
*Attorney, Agent, or Firm*—Oppenheimer Wolff & Donnelly LLP

[57] ABSTRACT

An analogue to digital converter system for digitizing a stream of analogue symbols, the analogue to digital converter system includes an analogue to digital converter for sampling the symbols at predetermined sample timings and a feedback loop for adjusting the sample timings. The feedback loop includes an eye opening detector connected to an output of the analogue to digital converter and responsive to successive digitized symbol samples to determine eye opening signals. The eye opening detector includes a deviation detector for determining a deviation signal representative of a deviation of a digitized symbol sample value with respect to a mean sample value. Preferably, a variance measurement calculator calculates the variance of these deviations. A feedback control is responsive to successive eye opening signals to generate timing control signals for adjusting the sample timings. The deviation detector can employ a fixed means sample value or can determine the mean sample value from a plurality of digitized sample values over a predetermined period. A variance calculator calculates a variance signal representative of a variance of a deviation signal value with respect to a mean deviation value. The variance calculator can determine the mean deviation value from a plurality of digitized sample values over a predetermined period. Successive variance values form the eye opening signals and an eye opening signal is output in response to each digitized symbol sample.

31 Claims, 5 Drawing Sheets

5,959,563

ANALOGUE TO DIGITAL CONVERTER WITH ADAPTIVE SAMPLE TIMING BASED ON STATISTICS OF SAMPLE VALUES

BACKGROUND OF THE INVENTION

1. Field of the Invention

This invention relates to an analogue to digital converter (A/D converter) system.

2. Description of the Prior Art

The present invention relates, in particular, to an A/D converter system which provides adaptive sample timing for digitizing a received stream of information symbols. Ideally, the sampling instant for an analogue to digital converter should be aligned with the centre (or eye) of each successive symbol.

U.S. Pat. No. 4,788,696 describes a decision timing control circuit for controlling the decision timing of an A/D converter. An error rate detector is employed to derive error rate information from the output of the A/D converter. This information is then used for controlling the phase of an A/D converter clock signal thereby to control the decision timing of the A/D converter. The circuit is applied to the field of digital radio communications and is dependent upon a clock signal which is recovered from a demodulated signal by a clock recovery circuit. The circuit described in U.S. Pat. No. 4,788,696, is complicated and, as a result of being based on error rate detection, is relatively slow in operation.

U.S. Pat. No. 4,565,993 describes a dynamic strobe timing circuit for an A/D converter. This converter employs circuitry for receiving information indicative of a recent history of amplitude variation of an analogue signal to logically modify the most significant error bit and to apply this to an integrator. An integrated value is then used to adjust a variable time delay clock circuit for use in determining the detection time for the A/D converter. This circuit is specifically directed to optimising the accuracy of signal detection for a multi-level signal. In operation, it is arranged to detect a slope of the angled signal by comparing the N most significant bits of a present and previous word value. The results of the comparison are integrated to determine a signal which is then used for adjusting the timing of a clock signal for initiating each A/D conversion.

U.S. Pat. No. 5,406,329 describes an A/D converter for converting a sampled image signal from a solid state optical image pick-up to a digital image signal. The circuit described therein employs a test signal generator for generating a test signal which is synchronised with a driving pulse for driving the image pick-up. This test signal is used to control the phase of a first sampling pulse and the phase of a second sampling pulse relative to each other. In a test mode, the output signal of an A/D converter is passed through a delay circuit having a delay of one clock period and a difference between the delayed signal and the non-delayed signal is derived by means of a subtracting circuit in order to determine an absolute difference between black and white levels. In the testing mode, a peak-to-peak value thus obtained is supplied to an integrator for integrating the absolute peak-to-peak values of the test signals. By comparing integrated values during successive horizontal blanking periods, a signal is supplied to a variable delay circuit for adjusting a phase of the sampling pulse for A/D conversion. This circuit is also complicated in construction, and is adapted for a particular purpose using a dedicated test signal.

Although the prior art documents described above provide circuits for adjusting the sampling time for an A/D converter, there remains a need to provide a solution to the determination of the timing of the sampling instant for an A/D converter which is aligned to the centre of each successive symbol of a stream of received information symbols to be digitized, without the need for complex and therefore expensive synchronisation and preferably without the need for the A/D converter to sample more frequently than once per symbol.

SUMMARY OF THE INVENTION

In accordance with a first aspect of the invention, there is provided an analogue to digital converter system for digitizing a stream of analogue symbols, the analogue to digital converter system comprising an analogue to digital converter for sampling the symbols at predetermined sample timings and a feedback loop for adjusting the sample timings, the feedback loop comprising: an eye opening detector connected to an output of the analogue to digital converter and responsive to successive digitized symbol samples to determine eye opening signals, the eye opening detector including a deviation detector for determining a deviation signal representative of a deviation of a digitized symbol sample value with respect to a mean sample value; and a feedback control responsive to successive eye opening signals to generate timing control signals for adjusting the sample timings.

Preferably, the deviation detector employs a fixed mean sample value. Alternatively, the deviation detector can determine the mean sample value from a plurality of digitized sample values over a predetermined period. In this manner the mean is continually updated.

For multi-valued symbols having more than two symbol values, the analogue to digital converter system preferably comprises a plurality of the deviation detectors, each for a respective signal value range.

Preferably, the eye opening detector comprises a variance calculator which calculates a variance signal representative of a variance of a deviation signal value with respect to a mean deviation value. More preferably, the variance calculator determines the mean deviation value from a plurality of digitized sample values over a predetermined period. In this manner the mean deviation value is also updated continuously.

Preferably, it is successive variance values which form the eye opening signals. Preferably, an eye opening signal is output in response to each digitized symbol sample. This provides a rapid response to changes in the system to keep the system operating at optimum performance without the need to apply a higher sample rate than once per symbol.

The feedback control is preferably responsive to successive eye opening signals to generate timing control signals for adjusting the sample timings to acquire and track sample timings coincident with eye opening.

The invention also provides an analogue to digital converter system for digitizing a stream of analogue symbols, the digital to analogue converter system comprising an analogue to digital converter for sampling the symbols at predetermined sample timings and a feedback loop for adjusting the sample timings, the feedback loop providing variable sample timing at one of a plurality of quantized sample timings.

Preferably, a variable timing delay is responsive to the timing control signals for applying one of a predetermined plurality of timing delays to a sample timing signal for the analogue to digital converter. Such an arrangement means that it is possible to implement the analogue to digital converter system without any analogue components other than the analogue to digital converter itself.

Alternatively, a variable signal delay responsive to the timing control signals for applying one of a predetermined plurality of timing delays to the analogue symbols before being input to the analogue to digital converter. In such an embodiment, the variable signal delay preferably comprises a plurality of bucket brigade devices.

The invention further provides an integrated circuit comprising an analogue to digital converter system for digitizing a stream of analogue symbols, the analogue to digital converter system comprising an analogue to digital converter for sampling the symbols at predetermined sample timings and a feedback loop for adjusting the sample timings, the feedback loop comprising: an eye opening detector connected to an output of the analogue to digital converter and responsive to successive digitized symbol samples to determine eye opening signals, the eye opening detector including a deviation detector for determining a deviation signal representative of a deviation of a digitized symbol sample value with respect to a mean sample value; and a feedback control responsive to successive eye opening signals to generate timing control signals for adjusting the sample timings. Preferably, the eye opening detector also includes a deviation variance calculator.

In accordance with a further aspect of the invention, there is provided a method of digitizing a stream of analogue symbols using an analogue to digital converter for sampling the symbols at predetermined sample timings and a feedback loop for adjusting the sample timings, the method comprising:
  a) determining eye opening signals in response to successive digitized symbol samples output from the analogue to digital converter, wherein step (a) includes a step of:
    (i) determining a deviation signal representative of a deviation of a digitized symbol sample value with respect to a mean digitized sample value; and
  b) generating control signals for adjusting the sample timings in response to successive eye opening signals.

Preferably, step (a) also includes a step (ii) of determining a variance signal representative of the variance of deviation signals with respect to a mean deviation value.

BRIEF DESCRIPTION OF THE DRAWINGS

Embodiments of the invention will be described hereinafter, by way of example only, with reference to the accompanying drawings in which like elements are identified by like reference signs and in which.

DESCRIPTION OF PREFERRED EMBODIMENTS

Figure 1:
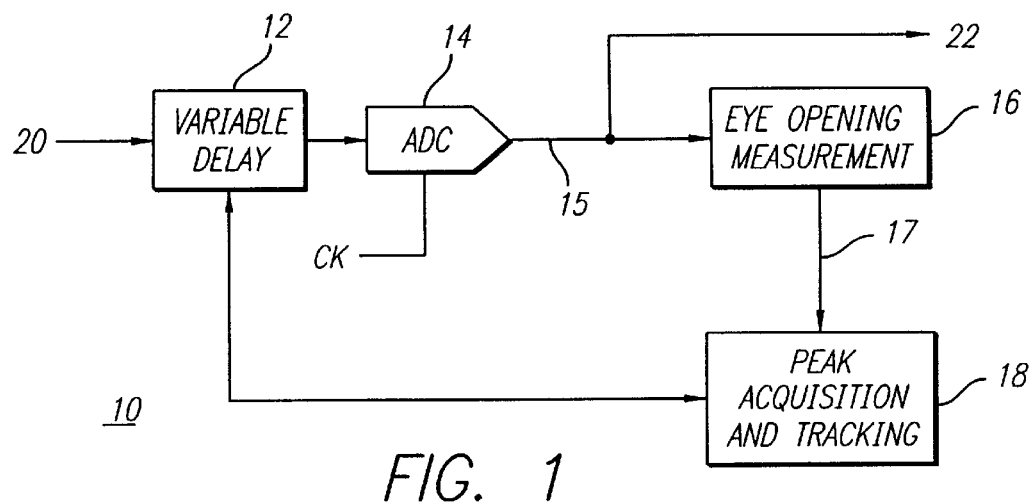
FIG. 1 is a schematic block diagram giving an overview of one example of an A/D converter system in accordance with the invention.

FIG. 1 is a schematic block diagram illustrating one example of an A/D converter system 10 in accordance with the present invention. In the following description various blocks in the diagrams are described as "modules". These modules may be implemented using any appropriate technology. Typically they will be implemented using conventional integrated circuit technology. However, they could be implemented using discrete components, or where appropriate using software, as required for any particular application.

In FIG. 1, analogue input signals 20 are received at a variable delay circuit 12 where a desired delay is applied before those signals are supplied to an A/D converter 14. The delay provided by the variable delay circuit 12 preferably delays the signal by a fraction of a symbol interval in a quantised fashion. The output of the A/D converter 14 is supplied to an eye opening measurement module 16. Digital output signal samples are provided at an output 22. Eye opening signals are output 17 from the eye opening measurement module 16 to a peak acquisition and tracking module 18. The peak acquisition and tracking module 18 generates timing signals for adjusting the timing of the variable delay 12.

In operation, the output 15 of the A/D converter 14 is a stream of binary samples representing the amplitude of the analogue information signals 20 to be digitized. The digital signal 15 output from the A/D converter 14 is passed to the eye opening measurement module 16 which determines statistical properties of the signal amplitudes. If the sampling instant is correctly aligned to the centre of the eye of each symbol, then the samples will fall into small bands of amplitudes representing the symbol value. For example, in a binary symbol, there are two values 1 or 0. For a correctly aligned sampling instant, the samples at the output of the A/D converter 14 would regroup together in two narrow bands of amplitude near each binary value of the symbol. Conversely, if the sampling instant coincides with a symbol transition, individual samples will be more widely spread in amplitude.

The eye opening measurement module 16 operates as an amplitude filter for determining the number of samples that fall within a predetermined range of amplitudes near each symbol value over a predetermined and fixed time interval. If the eye-measurement module 16 detects a low count, then this indicates poor alignment of the sampling instant. If the eye opening measurement module 16 detects a high count, then this indicates good alignment of the sampling instant.

The eye opening measurement module 16 outputs signals 17 representative of the count of the numbers of samples that fall within the predetermined range of amplitudes over the predetermined and fixed time interval. The signals 17 are supplied to the peak acquisition and tracking module 18, which is responsive to the signals 17 to generate timing signals 24 for adjusting the timing at which the analogue input signals 20 are received at the A/D converter 14. It is assumed in FIG. 1 that the A/D converter 14 samples in accordance with a fixed clock CK.

The variable delay device 12 is preferably a bucket brigade device with finite (quantized) delay steps controlled by the signal 24 from the peak acquisition and tracking module 18. The variable delay therefore delays the signal input to the A/D converter by up to one sample instant of the A/D converter in several steps depending on the sampling instant accuracy required. Thus, the sampling of the analogue input signal can be adjusted by the described delay lock loop to ensure that the sampling instant coincides with the best eye opening of each successive symbol.

Figure 2:
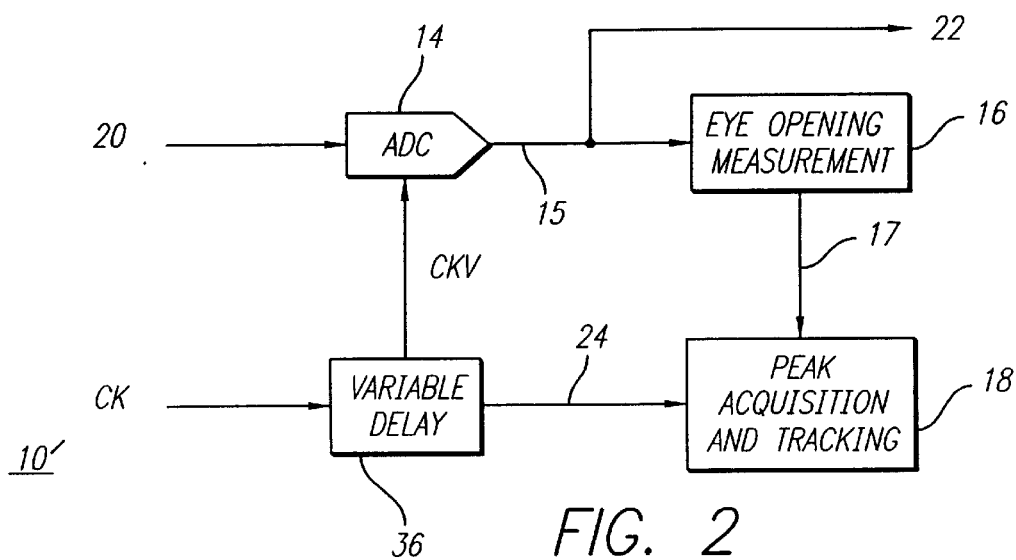
FIG. 2 is a schematic block diagram giving an overview of another example of an A/D converter system in accordance with the invention.

FIG. 2 illustrates an alternative to the arrangement of FIG. 1. In FIG. 2, it is assumed that the eye opening measurement module 16 and the peak acquisition and tracking module 18 correspond to the like numbered elements of FIG. 1. In FIG. 2, however, the A/D converter 14 receives a timing clock CKV determining a sampling instant which is variably controlled by a variable delay module 36. The variable delay device 12, of FIG. 1, is therefore not employed in the FIG. 2 arrangement. Accordingly, the sampling instant of the A/D converter 14 is varied rather than the timing of the incoming signals in order to provide sampling of the incoming symbols to coincide with the best eye opening of each successive symbol. The arrangement of FIG. 2 will typically be advantageous with respect to the arrangement of FIG. 1, because no signal distortion is introduced, and because it is easier to delay the digital clock signal for the A/D converter 14 than to delay the analogue signal 20.

Figure 7A:
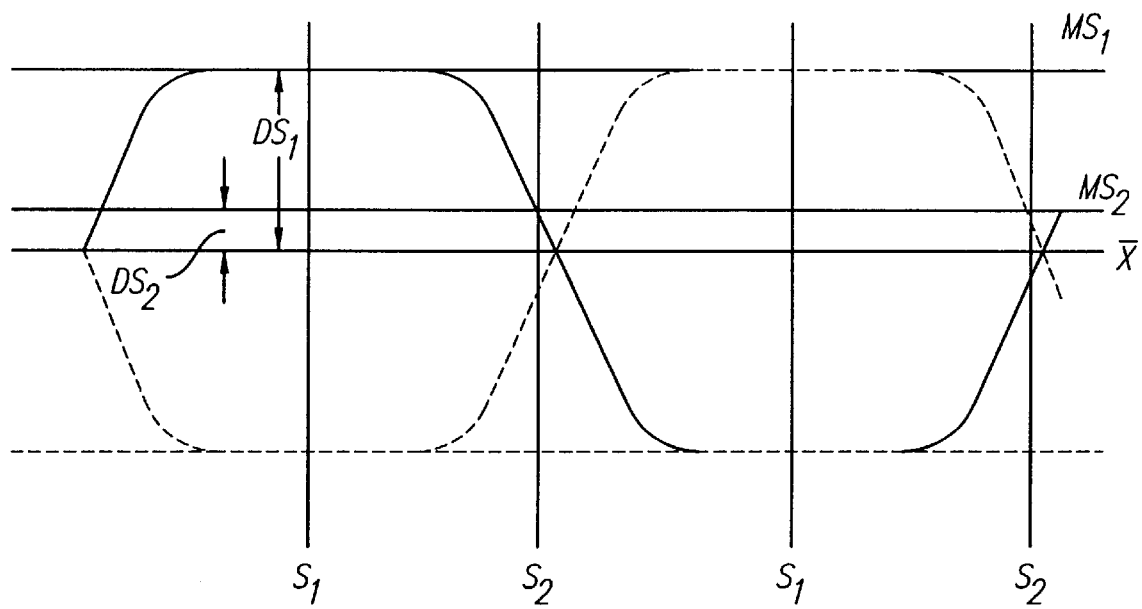
FIGS. 7A and 7B are diagrams illustrating signal waveshapes.

FIG. 7A illustrates the sampling of a binary signal intended to have values 0 and 1 distributed about a mean value $\bar{x}$ at a value 0.5. It will be noticed from the representation of the signal in solid lines (and its complement in dotted lines) that the period of each symbol has an "eye-like" shape. Ideally, the symbols should be sampled at the maximum values of the eye opening (at $S_1$). If a sample is made at $S_1$, a measured signal $MS_1$ will be output by the analogue to digital converter. However, if the signal were sampled at, for example, $S_2$, a signal value $MS_2$ would be obtained instead. The operation of the module 38 is essentially to determine a mean value $\bar{x}$ from successive sampled signals (which may not be exactly at 0.5), and then for each measured signal to determine a deviation from that mean. Thus, it will be appreciated that deviations measured near $S_1$ will be larger and more closely spaced on the whole than deviations measured near $S_2$ which will be smaller and more widely spaced on average.

Figure 3:
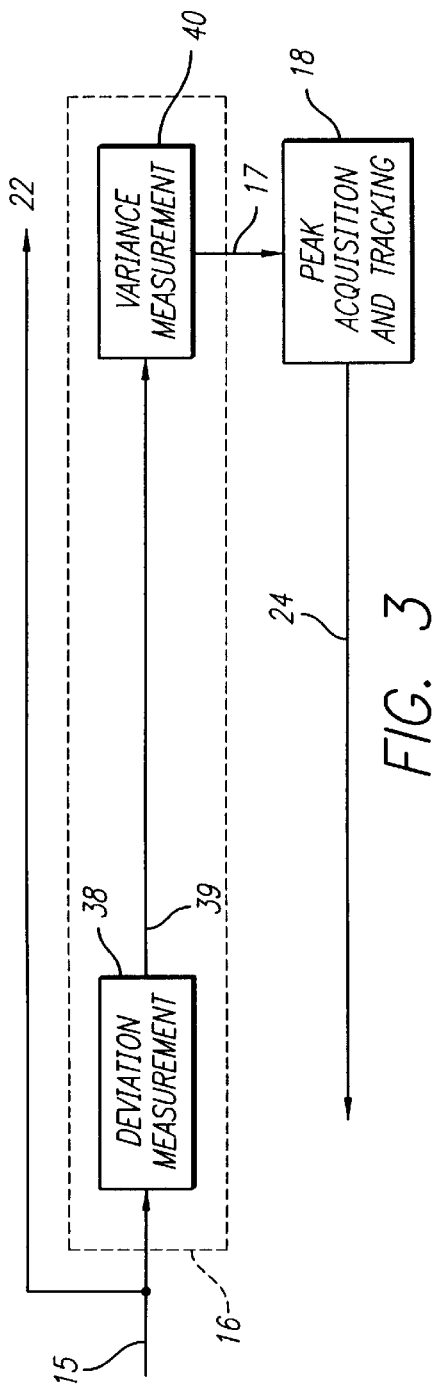
FIG. 3 is a schematic block diagram of one embodiment of elements of the systems shown in FIGS. 1 and 2.

FIG. 3 is a schematic diagram showing elements of the A/D converter systems shown in FIGS. 1 and 2. In particular, FIG. 3 illustrates in more detail, a preferred configuration for the eye opening measurement module 16. Thus, in FIG. 3, the N-bit binary samples produced by the A/D converter every symbol 15, are supplied to the input of the deviation module 38. The deviation module 38 computes the mean of the latest m-binary samples output by the A/D converter. It then computes the absolute value of the difference between each sample produced by the A/D converter and the current mean value.

An example of the operation of the module 38 can be represented by the following equations:

$$\text{mean } \bar{x} = \frac{1}{m} \sum_{n=0}^{n=m-1} x(n) \qquad \text{(ii)}$$

In other words, the module 38 can be arranged to derive the modulus of $(x-\bar{x})$, where $\bar{x}$ is the mean of x.

The mean $\bar{x}$ can be estimated by taking a running average as described above. Preferably however, the mean $\bar{x}$ is a fixed value, which can be held in storage, the fixed value being based on prior knowledge of the mean sample value. The use of a fixed value will normally result in more stable operation.

Thus a particular implementation of the module 38 will depend on the desired application. In a first application, where the A/D converter 14 is AC coupled and produces signed binary samples, the module 38 is arranged to remove the sign and to preserve the amplitude part of the binary sample. The mean value computation is implicit to the time constant of the A/D converter 14 AC input coupling. The absolute value of the deviation from the mean can then be derived by formatting the signed binary samples to compute the modulus of each sample.

In an alternative implementation where, for example, the A/D converter 14 is DC coupled and produces straight binary samples, the module 38 functions by comparing a running average over the most recent m samples, subtracts this from the current sample and removes the sign of the result. It will be appreciated that this is represented schematically in the equations above.

The output 39 of the module 38 which is called y(n) in equation (iii) above is supplied to the variance measurement module 40. The variance measurement module can implement the same mathematics as module 38 described in equations (i) to (iii) above producing an output y'(n) or $(y'(n))^2$ as follows:

$$y^1(n) = |y(n) - \bar{y}| \qquad \text{(iv)}$$

or $$(y'(n))^2 = |y(n) - \bar{y}|^2 \qquad \text{(v)}$$

The module 40 could alternatively average several variance results to form the variance measurement output 17. It will be noted with reference to FIG. 7A that at the optimum sampling times corresponding to $S_1$, the values of y(n) output 39 from module 38 will have a mean value near $MS_1$ with low variance. Therefore output 17 from module 40 will have a low value in this case. Conversely, at sampling times $S_2$ the values of y(n) output 39 from module 38 will have a mean value between $MS_1$ and zero and a large variance. In this case output 17 from module 40 will have a high value, indicating poor synchronisation. It will be appreciated that although this convention is used in this embodiment, alternative conventions could be used in other embodiments, (for example, a low output 17 from module 40 could be made to indicate poor synchronisation with "eye opening").

Figure 4A:
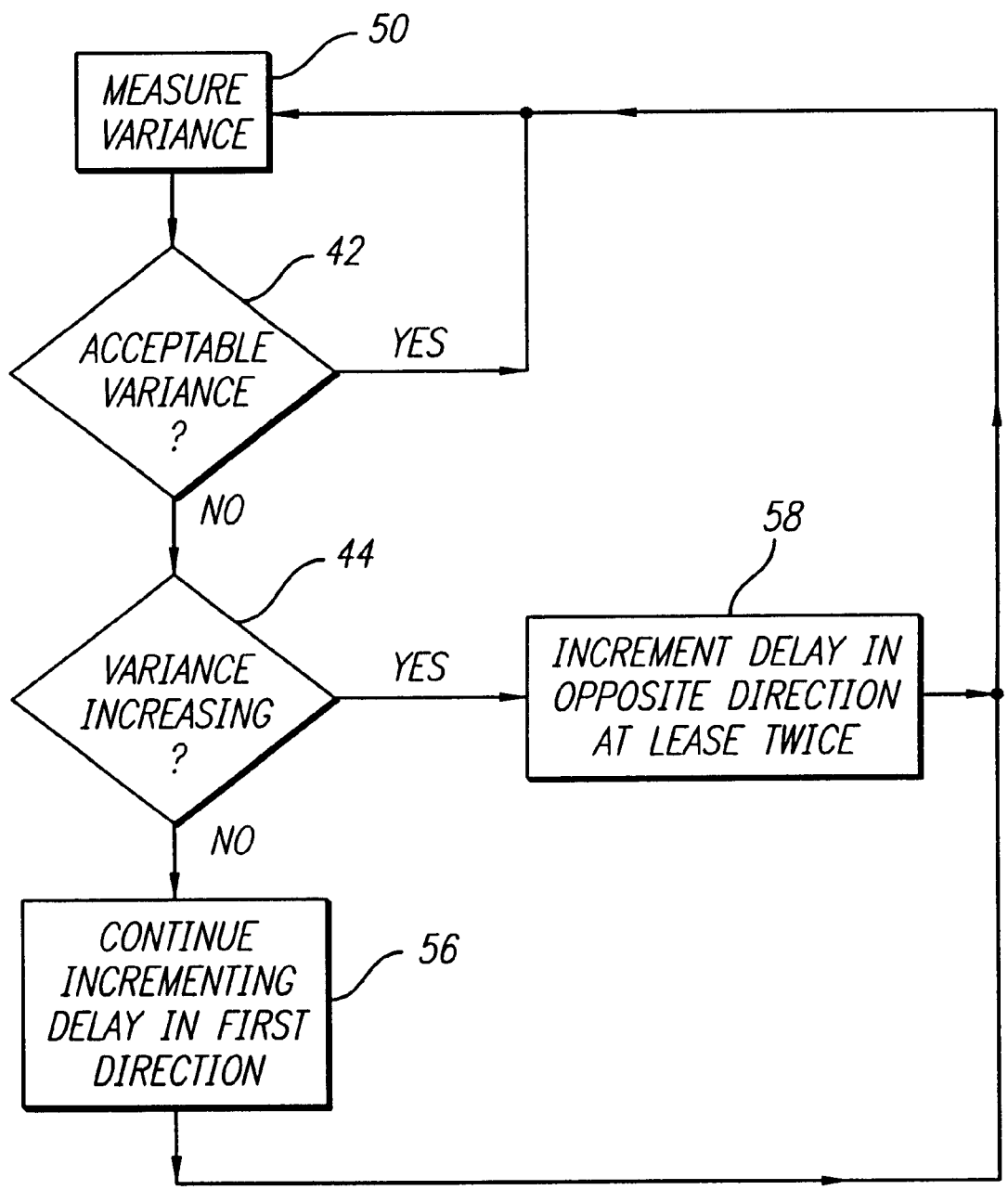
FIGS. 4A and 4B are first and second flow diagrams illustrating alternatives for aspects of the operation of the system of FIG. 3.

The peak acquisition and tracking module 18 provides a mechanism for varying the sampling delay until the minimum variance sample instant is identified. The mechanism then maintains the sample delay at the minimum of the variance input 17. A flow diagram representing one possible mechanism for operation of the peak acquisition and tracking module 18 is illustrated in FIG. 4A.

Step 50 represents the measurement of the variance by the eye opening measurement module 16. In step 42, the measured variance is compared to the variance value stored in a variance table and a determination is made whether the variance is acceptable. If the variance value is acceptable, then the variance is measured again in step 50.

If the variance value is not acceptable, then a determination is made in step 44 whether the variance is increasing or decreasing by comparison to a previous variance value.

If it is determined in step 44 that the variance is not increasing, then the sampling delay is stepped in a first direction in step 46 and then the variance is measured again in step 50.

If it is determined in step 44 that the variance is increasing, then the sampling delay is stepped at least twice in the opposite direction in step 48 and then the variance is measured again in step 50.

Where reference is made to stepping of the sampling delay, it is assumed that the sampling delay can have one of a predetermined number of quantized values represented in a cyclic manner (e.g. one of 8 values represented modulo 8) so that stepping (or incrementing/decrementing) the value in either direction will allow the value to be stepped through the entire range of delay increments. If T/8 spaced variable delay can be used, the possible delays available are: 0: $\frac{1}{8}$; $\frac{1}{4}$; $\frac{3}{8}$; $\frac{1}{2}$; $\frac{5}{8}$; $\frac{3}{4}$; $\frac{7}{8}$.

Accordingly, with the process described above, if the variance is acceptable, the existing sampling delay is not changed. However, if the variance not acceptable, but it is not increasing, it is assumed that a first direction of stepping is the correct one to achieve an acceptable variance. Alternatively, if the variance not acceptable, but it is increasing, it is assumed that the opposite direction of stepping is the correct one to achieve an acceptable variance. In the latter case, at least two, possibly three or more steps, in the opposite direction are used to stabilise and optimise the speed of the delay feedback mechanism. The precise number of steps for the sampling delay depends on the characteristics of the digitized signals and the amount of noise present.

Figure 4B:
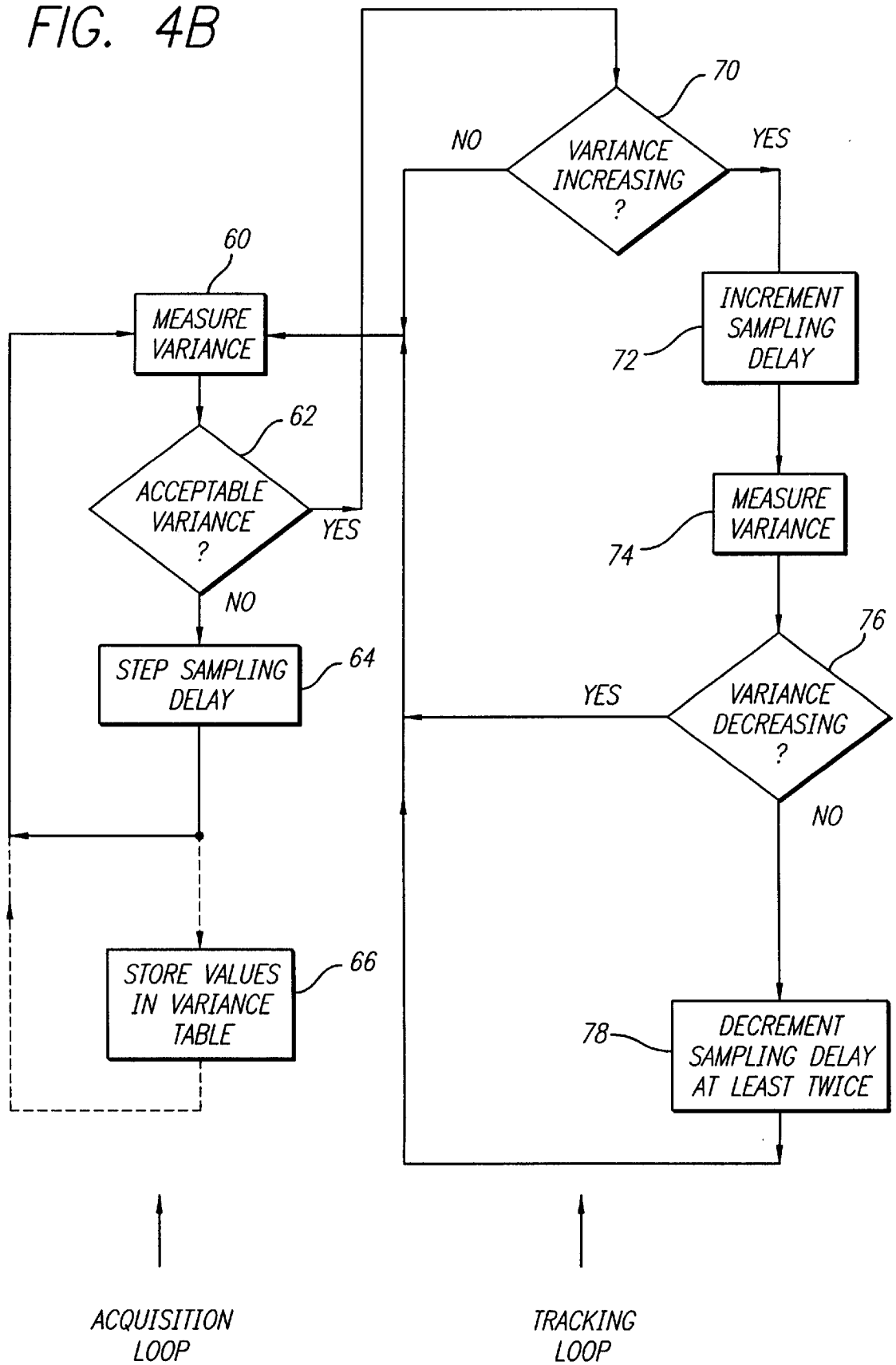

FIG. 4B is a flow diagram representing another possible mechanism for operation of the peak acquisition and tracking module 18.

Step 60 represents the measurement of the variance by the eye opening measurement module 16. In step 62, the measured variance is compared to the variance value stored in a variance table and a determination is made whether the variance is acceptable. If the variance value is not acceptable, then in step 64 the sampling delay is stepped.

If passed history data is stored in the variance table (can optionally be stored in step 66), this is used in step 64 to determine the direction in which the delay is stepped in order to improve the variance value. If no history data is stored, then the stepping of the delay in step 64 can be in a random direction or either direction. As for FIG. 4A, by using modulo 8 arithmetic, for example, stepping can occur in either direction and arrive at the appropriate delay to give the optimum variance.

In an optional step 66, data can be stored in the variance table to indicate the direction in which the delay has been stepped, along with the variance value prior to the step. If step 66 is present, this data can then be used in a subsequent step 44 in order to determine the direction in which the sampling delay should be stepped.

Steps 60, 62 and 64 (and optionally step 66) form an acquisition loop for acquiring the sample timings for aligning the sample timing with the maximum eye opening.

If, in step 62, the variance is adequately good, then a test is made in step 70 to determine whether the variance is increasing with time. If not, the variance is measured at step 60 for the next sample period. If the variance is increasing, then the sampling delay is incremented in step 72. The variance is then measured in step 74. If, in step 76, the variance is determined to be better, control returns to step 60 for measuring the next variance value. If, however, the variance was determined not to have improved in step 76, then the sampling delay is decremented at least twice in step 78 before control is returned to step 60. As in FIG. 4A, the precise number of steps for the sampling delay depends on the characteristics of the digitized signals and the amount of noise present.

Steps 70, 72, 74, 76 and 78 form a tracking loop for tracking the sampling timing to correspond to the maximum eye opening once it has been acquired by the logic of the acquisition loop.

Accordingly, if the variance improves, the existing sampling delay is not changed. However, if the variance worsens, the tracking attempts to improve it. If the variance worsens and cannot be improved by the tracking loop, the acquisition loop is once again used to select the best sampling delay.

In FIG. 4A, reference is made to stepping in a first direction and the opposite direction. This is because stepping in the first direction may be either be by incrementing or by decrementing, stepping in the opposite direction being by decrementing or incrementing, respectively. In FIG. 4B, reference is made to incrementing and decrementing the sampling delay, although it will be appreciated that these directions could be reversed.

The arrangement described above with reference to FIG. 3 is suitable for digitizing analogue signals which are binary in nature. However, for multi-level signals such as QAM, the variance will not vary as much within the sampling delay, as computed and described above. For multi-level signals, the module 38 is modified to compute a mean for each respective level and to determine a variance for each of those respective levels based on the signals distributed around the respective mean.

Figure 5:
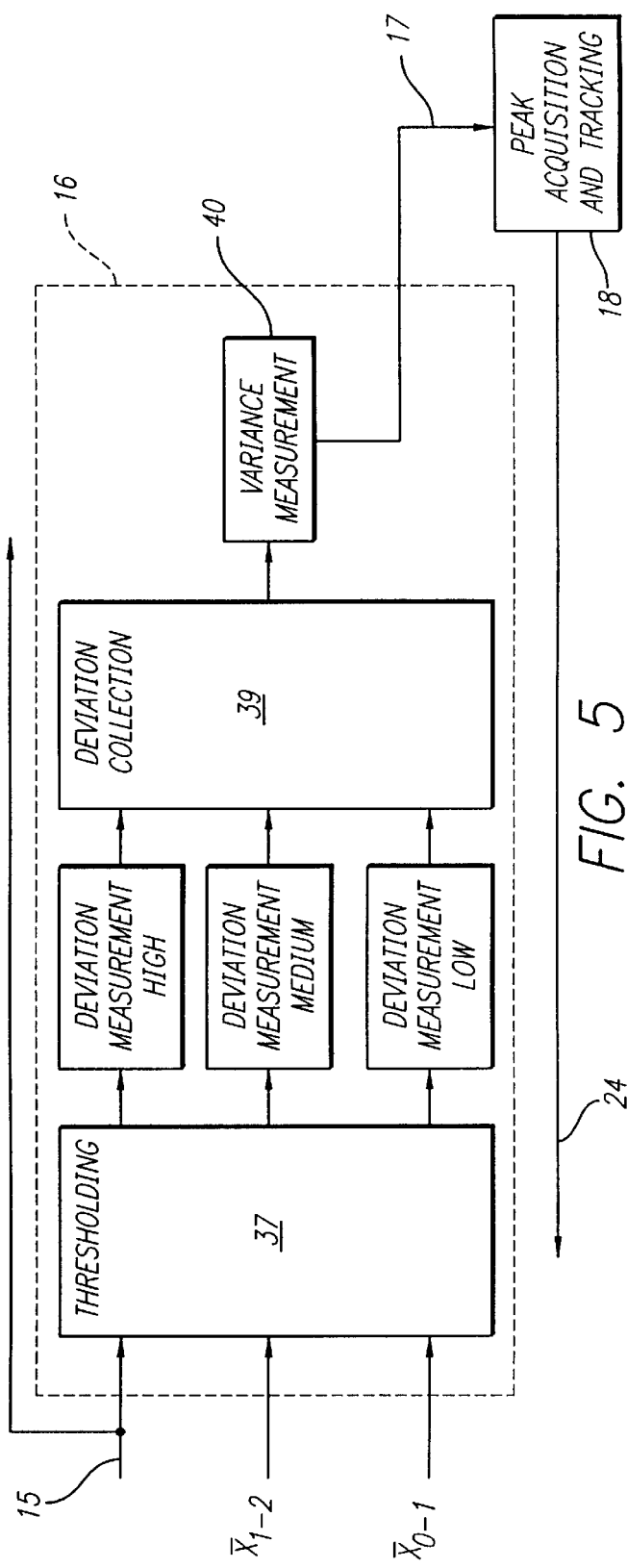
FIG. 5 is a schematic block diagram of an alternative embodiment of elements of the systems shown in FIGS. 1 and 2.
Figure 7B:
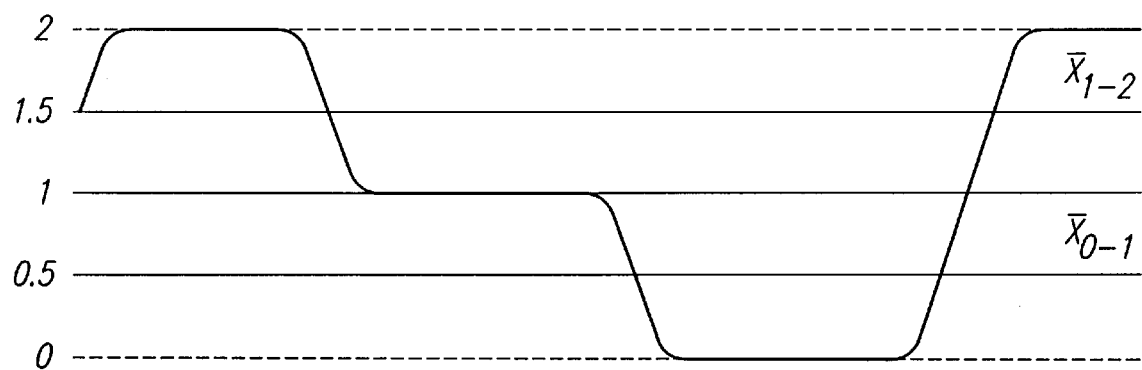

This is illustrated in FIGS. 5 and 7B for tertiary signals, which in the embodiment shown in FIG. 7B should have values 0, 1 or 2. As illustrated in FIG. 7B, a mean value $\bar{x}_{0-1}$ is ideally located at a value of 0.5 and a second mean value $\bar{x}_{1-2}$ is located ideally at a value of 1.5. As illustrated in FIG. 5, the module 38 is modified with respect to that of FIG. 3 by the provision of a thresholding circuit 37 responsive to threshold values and the provision of three modules 38H, 38M and 38L, each corresponding to the module 38 of FIG. 3. The output of the modules 38H, 38M and 38L are supplied to a module 39 which collects the deviation values output by the modules 38H, 38M and 38L. The threshold values are chosen to be substantially equal to the value of $\bar{x}_{01}$ and $\bar{x}_{12}$ so that signals in the range 1.5 to infinity are supplied to the module 38H, the signals in the range 0.5 to 1.5 are supplied to the module 38M and the signals in the range to −infinity to 0.5 are supplied to module 38L, each for computing a respective mean value and for deriving a deviation value for each signal received by that module with respect to that mean value.

It will be appreciated that the arrangement shown in FIG. 5 can be extended to signals having higher number of levels, such as QAM. In this case, a different number of thresholds would be supplied to the module 37. For example, for 16 QAM, four individual modules 38 could be provided to compute respective mean values for each of four symbol positions.

Figure 6:
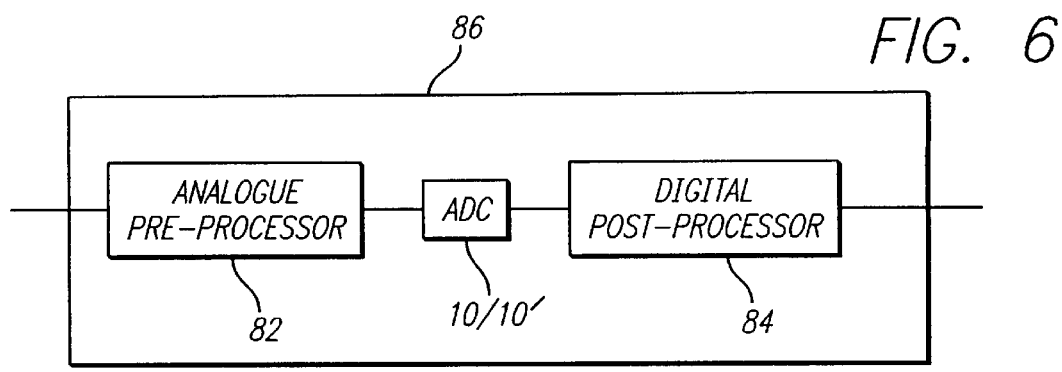
FIG. 6 is a schematic representation of an integrated circuit incorporating a system as described with references to FIGS. 1–5.

FIG. 6 is a schematic representation of an integrated circuit 86 incorporating an analogue to digital converter system 10, 10' as described in FIGS. 1–5 and 7. Also shown schematically in FIG. 6 are optional analogue pre-processing circuitry 82 and optional digital post-processing circuitry 84. The integrated circuit 86 may also comprise other circuitry not directly related to the analogue to digital conversion system 10/10'.

Accordingly, there has been described an analogue to digital conversion system which can allow the digitation of very high rate data. Previously, the data rate, or symbol rate that could be digitized, was limited to less than half the maximum feasible sampling rate of the analogue to digital converter. By using an embodiment of the present invention, it is possible to digitize a symbol rate up to the maximum feasible analogue to digital sampling rate, potentially providing at least a two-fold improvement in the maximum speed of digitization with any given analogue to digital converter.

An embodiment of the present invention provides for close control of the sampling instant and rapid adjustment of the sampling instant to track short term changes in the incoming signal rate.

Particularly in an embodiment of the invention as described with reference to FIG. 2, no additional analogue components, other than the analogue to digital converter itself, are needed in order to sample incoming symbols at the correct time. The lack of additional analogue components means that an analogue to digital converter system in accordance with the invention can be implemented readily and accurately with minimal variation in performance from one circuit to the next.

Although particular embodiments of the invention have been described herein, it will be appreciated that many modifications and/or additions are possible to the various embodiments and that other embodiments can be envisaged within the spirit and scope of the invention.

What is claimed is:

1. An analogue to digital converter system for digitizing a stream of analogue symbols, said analogue to digital converter system comprising an analogue to digital converter for sampling said symbols to produce symbol samples at predetermined sample timings and a feedback loop for adjusting said sample timings, said feedback loop comprising:
   an eye opening detector connected to an output of said analogue to digital converter and responsive to successive digitized symbol samples to determine eye opening signals, said eye opening detector including a deviation detector for determining a deviation signal representative of a deviation of a digitized symbol sample value with respect to a mean sample value; and
   a feedback control responsive to successive eye opening signals to generate timing control signals for adjusting said sample timings.

2. An analogue to digital converter system according to claim 1, wherein said deviation detector employs a fixed mean sample value.

3. An analogue to digital converter system according to claim 1, for multi-valued symbols having more than two symbol values, said analogue to digital converter system comprising a plurality of said deviation detectors, each for a respective signal value range.

4. An analogue to digital converter system according to claim 1, wherein said eye opening detector further comprises a variance calculator which calculates a variance signal representative of a variance of a value of said deviation signal with respect to a mean deviation value.

5. An analogue to digital converter system according to claim 4, wherein said variance calculator determines said mean deviation value from a plurality of digitized sample values over a predetermined period.

6. An analogue to digital converter system according to claim 4, wherein successive variance values form said eye opening signals.

7. An analogue to digital converter system according to claim 1, wherein a said eye opening signal is output in response to each digitized symbol sample.

8. An analogue to digital converter system according to claim 1, wherein said feedback control is responsive to successive eye opening signals to generate timing control signals for adjusting said sample timings to acquire and track said symbol samples for which a variance thereof corresponds to the best eye opening.

9. An analogue to digital converter system according to claim 1, providing variable sample timing at one of a plurality of quantized sample timings.

10. An analogue to digital converter system according to claim 1, further comprising a variable timing delay responsive to said timing control signals for applying one of a predetermined plurality of timing delays to a sample timing signal for said analogue to digital converter.

11. An analogue to digital converter system according to claim 1, further comprising a variable signal delay responsive to said timing control signals for applying one of a predetermined plurality of timing delays to said analogue symbols before said analogue symbols are input to said analogue to digital converter.

12. An analogue to digital converter system according to claim 11, wherein said variable signal delay comprises a plurality of bucket brigade devices.

13. An analogue to digital converter system according to claim 1, wherein said deviation detector determines said mean sample value from a plurality of digitized sample values over a predetermined period.

14. An analogue to digital converter system for digitizing a stream of analogue symbols, comprising:
   an analogue to digital converter for sampling said symbols at predetermined sample timings;
   a feedback loop for adjusting said sample timings, said feedback loop providing timing control signals for timing at one of a plurality of quantized sample timings; and
   a variable timing delay responsive to said timing control signals for applying one of a predetermined plurality of timing delays to a sample timing signal for said analogue to digital converter.

15. An analogue to digital converter system for digitizing a stream of analogue symbols, comprising:
   an analogue to digital converter for sampling said symbols at predetermined sample timings;
   a feedback loop for adjusting said sample timings, said feedback loop providing timing control signals for timing at one of a plurality of quantized sample timings; and
   a variable signal delay responsive to said timing control signals for applying one of a predetermined plurality of timing delays to said analogue symbols before said analogue symbols are input to said analogue to digital converter.

16. An analogue to digital converter system according to claim 15, wherein said variable signal delay comprises a plurality of bucket brigade devices.

17. A method of digitizing a stream of analogue symbols using an analogue to digital converter for sampling said symbols to produce symbol samples at predetermined sample timings and a feedback loop for adjusting said sample timings, said method comprising:
   a) determining eye opening signals in response to successive digitized symbol samples output from said digital to analogue converter, wherein step (a) includes a step of:
      (i) determining a deviation signal representative of a deviation of a digitized symbol sample value with respect to a mean sample value; and
   (b) generating timing control signals for adjusting said sample timings in response to successive eye opening signals.

18. A method according to claim 17, wherein step (a) comprises a further step of:
   (ii) employing a fixed mean sample value.

19. A method according to claim 17, for multi-valued symbols having more than two values, wherein step (a)(i)

comprises determining deviation values, each for a respective signal value range.

20. A method according to any one of claim 17, wherein step (a) comprises a further step of:
   (iii) calculating a variance signal representative of a variance of a deviation signal value with respect to a mean deviation value.

21. A method according to claim 20, wherein step (a)(iii) further comprises determining said mean deviation value from a plurality of digitized sample values over a predetermined period.

22. A method according to claim 20, wherein successive variance values form said eye opening signals.

23. A method according to claim 17, wherein a said eye opening signal is output in response to each digitized symbol sample.

24. A method according to claim 17 wherein step (b) comprises responding to successive eye opening signals to generate timing control signals for adjusting said sample timings to acquire and track said symbol samples for which a variance thereof corresponds to optimum eye opening.

25. A method according to claim 17, wherein step (b) includes providing variable sample timing at one of a plurality of quantized sample timings.

26. A method according to claim 17, wherein step (b) comprises responding to said timing control signals for applying one of a predetermined plurality of timing delays to a sample timing signal for said analogue to digital converter.

27. A method according to claim 17, wherein step (b) comprises responding to said timing control signals for applying one of a predetermined plurality of timing delays to said analogue symbols before said analogue symbols are input to said analogue to digital converter.

28. A method according to claim 17, wherein step (a) comprises a further step of:
   (ii) determining said mean sample value from a plurality of digitized sample values over a predetermined period.

29. An integrated circuit comprising an analogue to digital converter system for digitizing a stream of analogue symbols, said analogue to digital converter system comprising an analogue to digital converter for sampling said symbols at predetermined sample timings and a feedback loop for adjusting said sample timings, said feedback loop comprising:
   an eye opening detector connected to an output of said analogue to digital converter and responsive to successive digitized symbol samples to determine eye opening signals, said eye opening detector including a deviation detector for determining a deviation signal representative of a deviation of a digitized symbol sample value with respect to a mean sample value; and
   a feedback control responsive to successive eye opening signals to generate timing control signals for adjusting said sample timings.

30. An integrated circuit comprising an analogue to digital converter system for digitizing a stream of analogue symbols, said analogue to digital converter system comprising an analogue to digital converter for sampling said symbols at predetermined sample timings;
   a feedback loop for adjusting said sample timings, said feedback loop providing timing control signals for variable sample timing at one of a plurality of quantized sample timings; and
   a variable timing delay responsive to said timing control signals for applying one of a predetermined plurality of timing delays to a sample timing signal for said analogue to digital converter.

31. An integrated circuit comprising an analogue to digital converter system for digitizing a stream of analogue symbols, said analogue to digital converter system comprising an analogue to digital converter for sampling said symbols at predetermined sample timings;
   a feedback loop for adjusting said sample timings, said feedback loop providing timing control signals for variable sample timing at one of a plurality of quantized sample timings; and
   a variable signal delay responsive to said timing control signals for applying one of a predetermined plurality of timing delays to said analogue symbols before said analogue symbols are input to said analogue to digital converter.

* * * * *